US012713913B2

(12) United States Patent
Simpson et al.

(10) Patent No.: US 12,713,913 B2
(45) Date of Patent: Aug. 18, 2026

(54) SEMICONDUCTOR DEVICE

(71) Applicants: Dynex Semiconductor Limited, Lincoln (GB); Zhuzhou CRRC Times Semiconductor Co. Ltd, Zhuzhou (CN)

(72) Inventors: Robin Adam Simpson, Lincoln (GB); Michael David Nicholson, North Hykeham (GB); Yangang Wang, Lincoln (GB)

(73) Assignees: DYNEX SEMICONDUCTOR LIMITED, Lincoln (GB); ZHUZHOU CRRC TIMES SEMICONDUCTOR CO. LTD, Zhuzhou (CN)

( * ) Notice: Subject to any disclaimer, the term of this patent is extended or adjusted under 35 U.S.C. 154(b) by 184 days.

(21) Appl. No.: 18/551,950

(22) PCT Filed: Oct. 21, 2021

(86) PCT No.: PCT/EP2021/079217
§ 371 (c)(1),
(2) Date: Sep. 22, 2023

(87) PCT Pub. No.: WO2023/066489
PCT Pub. Date: Apr. 27, 2023

(65) Prior Publication Data

US 2024/0258192 A1 Aug. 1, 2024

(51) Int. Cl.
*H10W 40/22* (2026.01)
*H10W 72/00* (2026.01)
*H10W 90/00* (2026.01)

(52) U.S. Cl.
CPC .......... *H10W 40/22* (2026.01); *H10W 72/856* (2026.01); *H10W 90/724* (2026.01); *H10W 90/736* (2026.01)

(58) Field of Classification Search
CPC ..... H01L 23/3675; H01L 24/16; H01L 24/32; H01L 24/73; H01L 2224/16225;
(Continued)

(56) References Cited

U.S. PATENT DOCUMENTS

2003/0137037 A1* 7/2003 Omura .................. H01L 23/051 257/E23.078
2020/0274277 A1* 8/2020 Taylor .................. H01R 13/245

FOREIGN PATENT DOCUMENTS

JP 2004061197 2/2004

OTHER PUBLICATIONS

International Search Report and Written Opinion of International patent application No. PCT/EP2021/079217, dated Aug. 2, 2022, 11 pages.

* cited by examiner

*Primary Examiner* — Julia Slutsker
(74) *Attorney, Agent, or Firm* — Renner Otto Boisselle & Sklar LLP; Christopher Harris

(57) ABSTRACT

A semiconductor device comprising: a plurality of semiconductor chips; a first conductor and a second conductor arranged at opposite sides of the semiconductor chips, wherein the second conductor comprises a plurality of pillars, and wherein each of the semiconductor chips comprises: a first surface facing the first conductor; a first electrode arranged on the first surface and electrically coupled to the first conductor; a second surface opposite to the first surface; a second electrode arranged on the second surface and electrically coupled to a respective one of the pillars, and a control electrode arranged on the second surface and configured to switch a current flowing between the first electrode and the second electrode; a circuit board comprising openings penetrated by the plurality of pillars,
(Continued)

wherein the circuit board further comprises an electrically insulating layer, a first conductive film and a second conductive film.

20 Claims, 6 Drawing Sheets

(58) Field of Classification Search
CPC . H01L 2224/32245; H01L 2224/73203; H01L 23/051; H01L 24/72; H01L 25/072; H10W 40/02; H10W 72/856; H10W 90/724; H10W 90/736; H10W 90/00; H10W 72/00; H10W 76/138
See application file for complete search history.

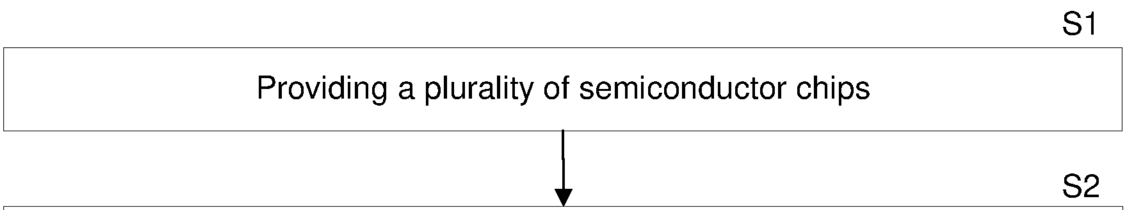

S2

Arranging a first conductor and a second conductor at opposite sides of the semiconductor chips, wherein the second conductor comprises a plurality of pillars, and wherein each of the semiconductor chips comprises: a first surface facing the first conductor; a first electrode arranged on the first surface and electrically coupled to the first conductor; a second surface opposite to the first surface; a second electrode arranged on the second surface and electrically coupled to a respective one of the pillars, and a control electrode arranged on the second surface and configured to switch a current flowing between the first electrode and the second electrode

S3

Passing the plurality of pillars through openings of a circuit board, wherein the circuit board further comprises an electrically insulating layer, a first conductive film and a second conductive film provided on opposite surfaces of the electrically insulating layer, and wherein the first conductive film is configured to form a first wiring pattern comprising first contact pads, and the second conductive film is configured to form a second wiring pattern comprising second contact pads;

S4

Using a plurality of electrical connectors to electrically connect the control electrodes of the semiconductor chips and respective ones of the first contact pads, and to apply a pressure against the circuit board

S5

Providing a plurality of conductive spacers which are fixedly connected to either the second conductor or respective ones of the second contact pads, wherein the second contact pads are electrically coupled, via the conductive spacers, to the second conductor by the pressure

Figure 11

SEMICONDUCTOR DEVICE

CROSS-REFERENCE TO RELATED APPLICATIONS

This application is a U.S. National Stage Application filed under 35 U.S.C. § 371 of PCT/EP2021/079217, filed Oct. 21, 2021, and entitled "SEMICONDUCTOR DEVICE". The entire contents of each of the above-identified patent applications are incorporated herein by reference.

TECHNICAL FIELD

The present disclosure relates to a semiconductor device. More particularly, but not exclusively, the present disclosure relates to a power semiconductor device which improves the simultaneous switching of semiconductor chips contained within the device, thereby improving the current sharing between the semiconductor chips and the reliability of the semiconductor device as a whole, without using additional components or sacrificing the thermal performance of the device.

BACKGROUND

A power semiconductor device is often used as a power switch for switching electric current in industrial equipment. In such applications, the power semiconductor device typically houses at least one power semiconductor chip (or die) which has a control terminal which switches on and off the current flowing through each chip. Examples of the power semiconductor chip include an insulated gate bipolar transistor (IGBT), an injection enhanced gate transistor (IEGT), a power metal-oxide-semiconductor field effect transistor (MOSFET), a power bipolar junction transistor (BJT), an integrated gate-commutated thyristor (IGCT), and a gate turn-off thyristor (GTO), etc. An IGBT typically has a gate terminal (i.e., the control terminal), a collector terminal and an emitter terminal. The voltage drop $V_{GE}$ between the gate and the emitter controls the collector current $I_C$. The IGBT has the advantages of being voltage driven, and having a fast switching speed and a small conducting loss while being capable of blocking a high voltage. Therefore, IGBTs are widely used in power switching applications.

FIG. 1 schematically illustrates a sectional view of a known power semiconductor device 100 which has a press-pack package. Press-pack power semiconductor devices are an alternative to traditional isolated-base power semiconductor devices, in which power semiconductor chips are typically soldered on isolated substrates that carry the chips respectively and are also wire-bonded to the substrates. Instead of the wire bonds and solder joints used in isolated-base devices, press-pack devices typically rely on the application of force by an external clamping system, to make contact to the chips. In this sense, the power semiconductor device 100 may also be referred to as a pressure-contact power semiconductor device.

As shown in FIG. 1, the press-pack power semiconductor device 100 comprises a plurality of IGBT chips 120. Individual IGBT chips 120 are connected in parallel within a single pressure contact housing to produce a single device 100 with a current handling capability that is ideally the sum of the capability of all the chips 120 contained within the housing. The IGBT chips 120 are placed between mechanical strain buffers 102, 103 to form semiconductor units 130. These semiconductor units 130 are then positioned between upper and lower electrodes 104, 105 in a hermetically-sealed housing which is formed by the electrodes 104, 105, a ceramic tube 108 and thin flanges 106, 107, 109. The thin flanges include a lid flange 106, a housing upper flange 107, and a housing lower flange 109. The thin flanges 106, 107, 109 make a gas-tight, flexible joint between the electrodes 104, 105 and the ceramic tube 108. The hermetically-sealed housing encloses an internal space 111. The internal space 111 is commonly filled with nitrogen.

In operation, the IGBT chips 120 are electrically and thermally connected between the upper and lower electrodes 104, 105. It is typical that one electrode (e.g., the upper electrode 104) is a flat electrode plate and the other (e.g., the lower electrode 105) has an electrode plate 119 and an array of pillars 110 formed on the inner surface of the electrode plate 119. The semiconductor units 130 typically have upper and lower contact regions of differing areas. As shown in FIG. 1, the pillars 110 of the lower electrode 105 permit contact to the smaller areas at the bottom surfaces of the semiconductor units 130.

Collector pads of the IGBT chips 120 are typically provided on the upper surfaces of the IGBT chips 120, and are electrically and thermally coupled to the upper electrode 104. Gate and emitter pads of the IGBT chips 120 are typically formed on the lower surfaces of the IGBT chips 120. The emitter pads are typically of a much greater size than the gate pads, and are electrically and thermally coupled to the pillars 110 of the lower electrode 105.

A driver circuit is used to control the operation of the IGBT chips 120. Connections must be made between the driver circuit and the gate and emitter pads of the IGBT chips 120. The driver circuit feeds drive signals (e.g., a gate current $I_G$) to the IGBT chips 120. The drive signals are typically of a low power rating. On the other hand, a power circuit is used to conduct power current (e.g., the collector current $I_C$) that flows through the IGBT chips 120, and is capable of withstanding much higher power ratings. For example, the buffers 102, 103 and the electrodes 104 and 105 belong to the power circuit.

The driver circuit includes a dedicated circuit board 115 that is provided within the device 100 to distribute the drive signals to the individual chips 120. The drive signals are typically generated by a gate drive circuit (not shown in FIG. 1) which is external to the device 100. Connection to the gate pad of each chip 120 is commonly made directly using a spring contact probe 116, which is compressed between a gate drive pad on the circuit board 115 and the gate pad on a respective chip 120. The gate drive pads are interconnected by a wiring pattern on the circuit board 115 which is further bonded to a gate terminal 122 that penetrates the side wall of the ceramic tube 108. The gate terminal 122 receives a gate drive signal from the external gate drive circuit.

Direct connection of the emitter branch of the driver circuit is more difficult, since it is typical to provide only a single, large emitter pad on the chip 120 and this is used for connection to the power circuit and as a thermal contact for the extraction of heat. It is preferable to minimise electrical and thermal resistances by ensuring the power connection to the chips 120, made by the pillars 110, has the largest surface area possible. If this design approach is taken, there is insufficient room to make a separate direct contact between the emitter pad on the chip 120 and the drive signal distribution circuit board 115. Therefore, the driver circuit is typically completed by connecting the emitter branch of the driver circuit to the lower electrode 105. In the example of FIG. 1, an emitter control terminal 124 is connected to the flange 109 by welding, with the flange 109 being electrically connected to the lower electrode 105. Alternatively, the emitter control terminal 124 can be directly connected to a peripheral portion of the lower electrode 105.

In operation of the device 100, a gate current $I_G$ flows into the gate terminal 122 and flows out of the emitter control terminal 124. The gate current $I_G$ is generated by the external gate drive circuit which is connected between the gate terminal 122 and the emitter control terminal 124. The gate current $I_G$ sequentially flows in the gate terminal 122, the wiring pattern on the circuit board 115, the spring contact probe 116, the gate pads of the IGBT chips 120, the IGBT chips 120, the emitter pads of the IGBT chips 120, the lower strain buffers 103, the pillars 110, the electrode plate 119, and the emitter control terminal 124. The flow of the gate current $I_G$ raises the potential of the gate pads of the IGBT chips 120 with respect to the emitter pads of the same chips 120. A power current $I_C$ sequentially flows in the upper electrode 104, the upper strain buffers 102, the collector pads of the IGBT chips 120, the IGBT chips 120, the emitter pads of the IGBT chips 120, the lower strain buffers 103, the pillars 110 and the electrode plate 119.

As described above, the driver circuit (along which the gate current $I_G$ flows) shares a common path with the power circuit (along which the power current $I_C$ flows), and the common path lies along the length of the electrode plate 119. It is known that where there is a common path, the current flow in the power circuit affects the performance of the driver circuit, and the effect of the power current varies depending on the relative directions of the current flow in the driver and power circuits. Either positive or negative feedback may occur, causing the chips 120 to switch on/off at different speeds. Equivalent circuit diagrams illustrating the effects are shown in FIGS. 2 and 3.

In FIG. 2, the current flow in the power circuit is along the same direction as the current flow in the driver circuit. FIG. 2 shows that three adjacent IGBT chips T1, T2, T3 (examples of the chips 120) are connected in parallel, and that the power current $I_C$ is extracted from a power terminal 150 which is proximate to the emitter control terminal 124. In FIG. 3, the current flow in the power circuit is along a direction opposite to the current flow in the driver circuit. FIG. 3 shows that the power current $I_C$ is extracted from a power terminal 150 which is located opposite to the emitter control terminal 124.

In each of FIGS. 2 and 3, the electrode plate 119 has parasitic inductance (represented by inductors 139) distributed along its length, and the value of each inductor 139 is determined by the length of the common path (e.g., the centre-to-centre distance of neighbouring pillars 110) between the driver circuit and the power circuit. During operation, fast changes in the power current $I_C$ during switching induce voltages across the inductors 139. The induced voltages are counteractive to (i.e., negative emitter feedback) the gate charge/discharge process in FIG. 2, and, on the other hand, boost (i.e., positive emitter feedback) the gate charge/discharge process in FIG. 3. Whether the IGBT chips experience asymmetrical negative or positive feedback is determined by the orientation of the external connections made to the device 100, which can be influenced by an end-user. Therefore, the existing design will lead to non-simultaneous switching of IGBT chips 120 and will contribute to unbalanced distribution of switching losses.

Further, during switching, the effect of the power circuit current causes significant variations in gate-emitter voltage across the individual chips 120, which in turn cause an imbalance in the current carried by the individual chips 120. Since the individual chips 120 have an upper limit with regards to their current handling capability, an imbalance will degrade the safe operating limit of the device 100 as a whole. For example, when the device 100 is being switched off, the effect of the power circuit current may cause some of the chips 120 to turn off faster than others; the last chip to turn off may have to turn off too much of the total current of the device 100 and may fail or be overstressed. The situation becomes worse as the current rating and therefore size of the device 100 is increased, since the length and therefore inductance of the common path will increase along with the levels of current.

Therefore, it is generally desirable to minimise the effect of the power circuit current flow on the performance of the driver circuit.

A known solution is described in U.S. Pat. No. 9,601,473B2, in which an area of the emitter pad of each chip is given over to the connection of a separate spring contact probe. The separate spring contact probe is connected to an auxiliary emitter bond pad provided on the top surface of a PCB board. The auxiliary emitter bond pads are then electrically connected to an auxiliary emitter terminal which extends through the ceramic tube to an exterior of the press-pack device. This solution isolates the driver circuit from the power circuit since the driver circuit uses no part of the power emitter electrode (e.g., the lower electrode 105). However, it necessitates the use of additional components (i.e., further spring contact probes). Further, since part of the emitter pad of each chip is required for connection of the separate spring contact probe, the contact area available for the cooling on the emitter pad is reduced, thereby impacting the thermal resistance of the device as a whole.

It is an object of the present disclosure, among others, to provide an improved semiconductor device, which solves problems associated with known semiconductor devices, whether identified herein or otherwise.

SUMMARY

According to a first aspect of the present disclosure, there is provided a semiconductor device, comprising:

a plurality of semiconductor chips;

a first conductor and a second conductor arranged at opposite sides of the semiconductor chips, wherein the second conductor comprises a plurality of pillars, and wherein each of the semiconductor chips comprises: a first surface facing the first conductor; a first electrode arranged on the first surface and electrically coupled to the first conductor; a second surface opposite to the first surface; a second electrode arranged on the second surface and electrically coupled to a respective one of the pillars, and a control electrode arranged on the second surface and configured to switch a current flowing between the first electrode and the second electrode;

a circuit board comprising openings penetrated by the plurality of pillars, wherein the circuit board further comprises an electrically insulating layer, a first conductive film and a second conductive film provided on opposite surfaces of the electrically insulating layer, and wherein the first conductive film is configured to form a first wiring pattern comprising first contact pads, and the second conductive film is configured to form a second wiring pattern comprising second contact pads;

a plurality of electrical connectors which electrically connect the control electrodes of the semiconductor chips and respective ones of the first contact pads and are configured to apply a pressure against the circuit board; and a plurality of conductive spacers which are fixedly connected to either the second conductor or respective ones of the second contact pads, and wherein the second contact pads are electrically coupled, via the conductive spacers, to the second conductor by the pressure.

Advantageously, the semiconductor device creates connections, which have low and balanced impedances, between the circuit board and the second electrodes of the semiconductor chips, without using additional electrical connectors or sacrificing the thermal performance of the semiconductor device. The connections are achieved by the creation of second contact pads on the circuit board, and the creation of conductive spacers which are fixedly connected to either the second conductor or respective ones of the second contact pads. The electrical connectors have dual functions—not only electrically connecting the control electrodes of the semiconductor chips and the first contact pads, but also applying a mechanical force to the circuit board in order to force a pressure contact between the second contact pads and the second conductor via the conductive spacers.

The connections between the circuit board and the second electrodes of the semiconductor chips can be largely or completely decoupled from a power circuit. Thus, during switching, the effect of a power circuit current flowing through the semiconductor device would not cause noticeable imbalance in the current carried by the individual semiconductor chips. Therefore, the connections improve the simultaneous switching and the current sharing between the semiconductor chips, and also improve the reliability of the semiconductor device as a whole. The simplicity of the connections also reduces the manufacturing costs of the semiconductor device.

The term “fixedly connected” used in the present disclosure means that the connected elements may be integrally formed or, alternatively, may be securedly bonded together (e.g., by a soldering, sintering or brazing process, or by using a conductive adhesive) such that the fixedly connected elements can be handled as a single-piece item. It would be appreciated that elements which form pressure contact with one another are not fixedly connected.

With the expression “the second contact pads are electrically coupled, via the conductive spacers, to the second conductor by the pressure”, it is meant that at least one of the interface(s) between the second contact pads and the second conductor is a dry interface. In other words, the second contact pads and the second conductor are compression-bonded. A dry interface means that elements at opposite sides of the interface are coupled by pressure only, and there is no bonding material between the elements. The dry interface may be between the second contact pads and the conductive spacers, or may be between the conductive spacers and the second conductor, depending upon whether the conductive spacers are fixedly connected to the second conductor or the second contact pads.

The plurality of semiconductor chips may be electrically connected in parallel to one another, between the first conductor and the second conductor.

It would be understood that the plurality of semiconductor chips comprise at least two semiconductor chips.

A centre of at least one of the first contact pads may be aligned with a centre of at least one of the second contact pads.

By the expression “aligned with”, it is meant that the location of the centre of the first contact pad and the location of the centre of the second contact pad are substantially coincident when viewed along a direction which is perpendicular to the electrically insulating layer (e.g., the first direction described below).

Advantageously, the aligned arrangement allows the pressure applied by the electrical connectors to be efficiently transferred across the circuit board, so as to improve the pressure contact between the second contact pads and the second conductor.

A centre of at least one of the first contact pads may be aligned with a centre of at least one of the control electrodes of the semiconductor chips. Further or alternatively, a centre of at least one of the second contact pads may be aligned with a centre of at least one of the conductive spacers.

The electrical connectors may be compressible connectors. The electrical connectors may comprise spring loaded connectors.

The conductive spacers may be rigid. In other words, the conductive spacers are non-deformable, particularly when the electrical connectors apply pressure against the circuit board.

The semiconductor device may further comprise: a first control terminal electrically connected to the first wiring pattern; a second control terminal electrically connected to the second wiring pattern; a first power terminal formed by or electrically connected to the first conductor; and a second power terminal formed by or electrically connected to the second conductor. The first and second control terminals may be for controlling a current flowing between the first power terminal and the second power terminal.

The second conductor may comprise a recess between the plurality of pillars. The conductive spacers may be arranged within the recess.

At least one of the conductive spacers may extend from a respective one of the pillars into the recess.

The at least one of the conductive spacers may not extend beyond a point of contact between a respective electrical connector and a respective first contact pad. Advantageously, this arrangement tends to cause flexure of the circuit board and can force a higher pressure contact between an edge of the conductive spacer and the second contact pad on the circuit board.

The second conductor may comprise a conductive plate extending between at least some of the pillars. The conductive plate may comprise a planar surface facing the semiconductor chips.

At least one of the plurality of pillars may extend along a first direction which is perpendicular to the second surface of the semiconductor chips, and the conductive plate (or the planar surface) may extend along a plane which is perpendicular to the first direction. It would be understood that the planar surface defines a boundary of the recess.

At least one of the conductive spacers may have a surface which faces the conductive plate and is spaced apart from the planar surface of the conductive plate.

In other words, the at least one of the conductive spacers is undercut, which is useful for improving mechanical compliance and for further decoupling a driver circuit from a power circuit of the semiconductor device.

At least one of the conductive spacers may extend from the planar surface into the recess.

The second wiring pattern may be separated from the planar surface of the conductive plate by the conductive spacers.

At least one of the conductive spacers may be fixedly connected to a respective one of the pillars and the conductive plate. In other words, the at least one of the conductive spacers may be located at a joint between the respective one of the pillars and the conductive plate.

At least one of the conductive spacers may comprise a planar surface, which faces the semiconductor chips and is configured to form a pressure contact with a respective one of the second contact pads.

The planar surface of the at least one of the conductive spacers may have an area which is less than or equal to an area of the respective one of the second contact pads.

At least one of the conductive spacers may comprise a planar surface facing the semiconductor chips, and a contact region which protrudes over the planar surface. The contact region may have a smaller area than the planar surface and may be configured to form a pressure contact with a respective one of the second contact pads.

Advantageously, the contact region is useful for increasing the contact pressure and therefore lowering electrical contact resistance between the second contact pad and the conductive spacer.

The circuit board may comprise a slot which extends through the electrically insulating layer and partially surrounds at least one of the first contact pads and/or at least one of the second contact pads.

The conductive spacers may be made of a material different from a material of the second conductor and/or a material of the second contact pads.

The semiconductor chips may be electrically coupled to the first conductor and/or the second conductor by pressure. In other words, at least one of the first conductor and the second conductor may form a pressure contact with the plurality of semiconductor chips, and the pressure contact does not require any bonding material.

The semiconductor device may be a power semiconductor device.

At least one of the semiconductor chips is an insulated gate bipolar transistor.

The semiconductor device may further comprise a first strain buffer electrically connected between the first electrode and the first conductor, and a second strain buffer electrically connected between the second electrode and the respective one of the pillars.

According to a second aspect of the present disclosure, there is provided a method of manufacturing a semiconductor device, comprising:

- providing a plurality of semiconductor chips;
- arranging a first conductor and a second conductor at opposite sides of the semiconductor chips, wherein the second conductor comprises a plurality of pillars, and wherein each of the semiconductor chips comprises: a first surface facing the first conductor; a first electrode arranged on the first surface and electrically coupled to the first conductor; a second surface opposite to the first surface; a second electrode arranged on the second surface and electrically coupled to a respective one of the pillars, and a control electrode arranged on the second surface and configured to switch a current flowing between the first electrode and the second electrode;
- passing the plurality of pillars through openings of a circuit board, wherein the circuit board further comprises an electrically insulating layer, a first conductive film and a second conductive film provided on opposite surfaces of the electrically insulating layer, and wherein the first conductive film is configured to form a first wiring pattern comprising first contact pads, and the second conductive film is configured to form a second wiring pattern comprising second contact pads;
- using a plurality of electrical connectors to electrically connect the control electrodes of the semiconductor chips and respective ones of the first contact pads, and to apply a pressure against the circuit board; and
- providing a plurality of conductive spacers which are fixedly connected to either the second conductor or respective ones of the second contact pads, wherein the second contact pads are electrically coupled, via the conductive spacers, to the second conductor by the pressure.

Where appropriate any of the optional features described above in relation to the first aspect of the present disclosure may be applied to the second aspect of the disclosure.

The expression "integrally formed" used in the present disclosure means that integrally formed elements are connected together so as to make up a single complete piece or unit, and so as to be incapable of being easily dismantled without destroying the integrity of the piece or unit.

It would also be understood that the terms "first", "second" are simply used in the present disclosure to label the relevant elements (e.g., "conductors", "surfaces" and "contact pads" etc.) for the ease of description, and do not imply any limitations to the sequence or locations of the relevant elements.

BRIEF DESCRIPTION OF THE DRAWINGS

In order that the disclosure may be more fully understood, a number of embodiments of the disclosure will now be described, by way of example, with reference to the accompanying drawings, in which:

FIG. 11 shows process steps of a method for manufacturing a semiconductor device.

In the figures, like parts are denoted by like reference numerals.

It will be appreciated that the drawings are for illustration purposes only and are not drawn to scale.

DETAILED DESCRIPTION OF THE PREFERRED EMBODIMENTS

Figure 4:
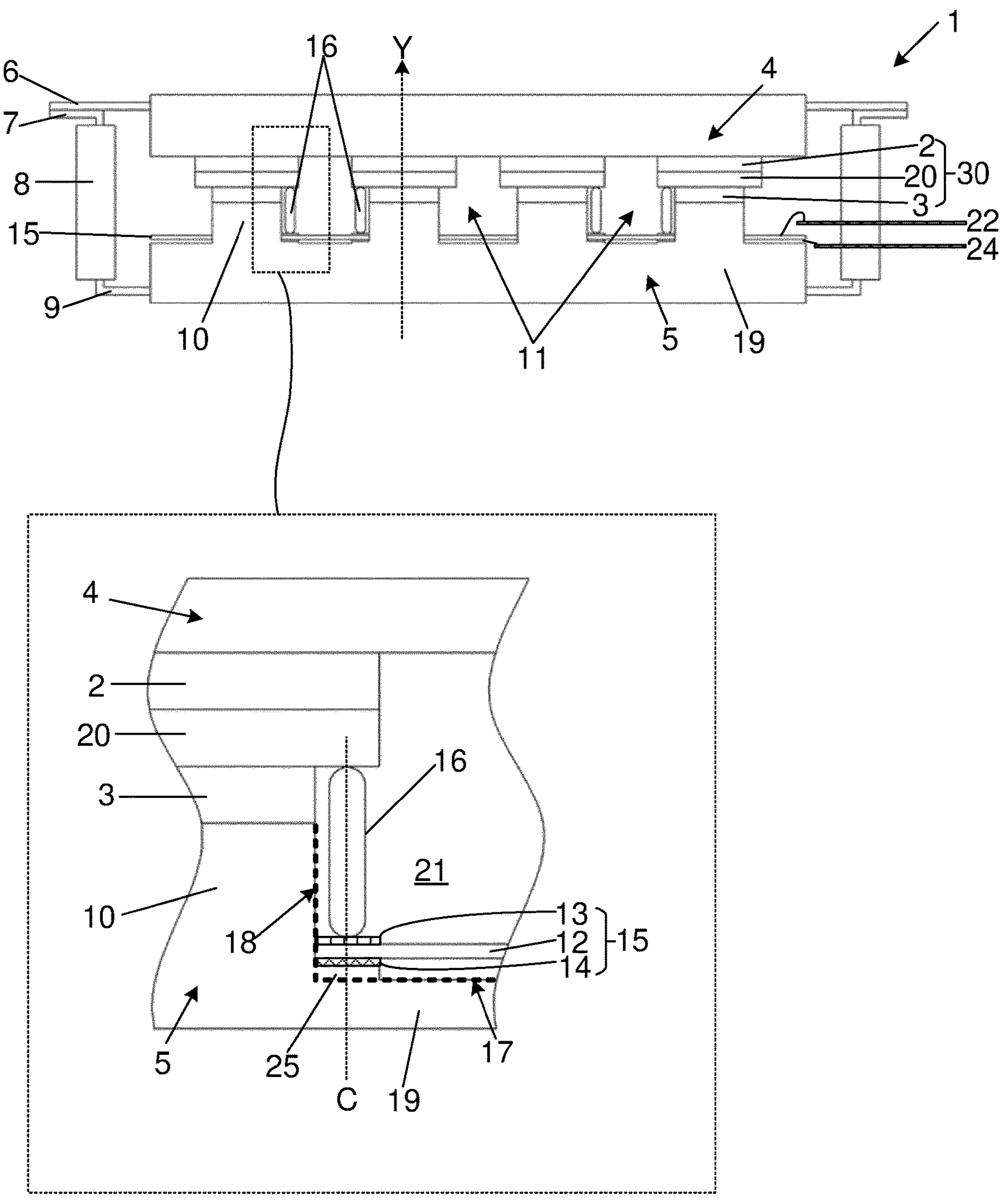
FIG. 4 schematically illustrates a sectional view of a semiconductor device according to a first embodiment of the present disclosure.

FIG. 4 schematically illustrates a cross-sectional view of a semiconductor device 1 (referred to as the "device" below) according to a first embodiment of the present disclosure. In this embodiment, the semiconductor device 1 is a multi-chip press-pack power semiconductor device, and functions as a power electronic switch.

As shown in FIG. 4, the device 1 comprises a plurality of power semiconductor chips 20 (referred to as the "chips" below), and upper and lower strain buffers 2, 3 provided at opposite sides of the chips 20. A combination of a single chip 20 with its associated strain buffers 2, 3 may be referred to as a semiconductor unit 30. It would, however, be appreciated that the strain buffers 2, 3 may be wholly or partly omitted from the semiconductor units 30. The device 1 further comprises a first conductor 4 and a second conductor 5 arranged at opposite sides of the semiconductor unit 30. As shown in FIG. 4, the first conductor 4 takes the form of a conductive plate and has substantially planar upper and lower surfaces. The second conductor 5 comprises a conductive plate 19 and a plurality of pillars 10 which extends from an inner surface 17 (inset of FIG. 4) of the conductive plate 19. The conductive plate 19 and the plurality of pillars 10 are typically integrally formed by employing a material removal process.

Each chip 20 has a first surface (i.e., the upper surface) facing the first conductor 4, and a first electrode arranged on the first surface and electrically coupled to the first conductor 4 via the upper strain buffer 2. Each chip 20 also has a second opposite surface (i.e., the lower surface), and a second electrode arranged on the second surface and electrically coupled to a respective one of the pillars 10 via the lower strain buffer 3.

Further, each chip has a control electrode arranged on the second surface and configured to switch a current flowing between the first electrode and the second electrode. It would be appreciated that the control electrode has a much smaller area than the second electrode. Further, with reference to FIG. 4, the second electrode has a smaller contact area than the first electrode. In an example, the chips 20 are IGBT chips. Therefore, the first electrode, the second electrode, and the control electrode are also referred to as the "collector electrode", the "emitter electrode" and the "gate electrode", respectively, in the following description. It would be appreciated that the chips 20 may be non-IGBTs, which include, for example, IEGTs, MOSFETs, BJTs, thyristors (e.g., IGCTs and GTOs) etc. The chips 20 may be made in silicon technology, or alternatively may be based upon other types of semiconductors, such as, silicon carbide, gallium nitride, or silicon germanium etc.

As shown by FIG. 4, the semiconductor units 30 are laterally spaced to one another, and are electrically connected in parallel between the first conductor 4 and the second conductor 5. Therefore, the overall current rating of the device 1 is generally determined by the number of semiconductor units 30 paralleled inside the device 1 and the current rating of each semiconductor unit 30.

The first and second conductors 4, 5 are typically made of copper. The strain buffers 2, 3 are typically made of molybdenum. During normal operation of the device 1, the device 1 heats and cools, and consequently each component of the device 1 undergoes thermal expansion and contraction. Difference in the thermal expansion coefficients of adjacent components leads to abrasive wear (also called "fretting") of their contact surfaces. The thermal expansion coefficients of silicon and molybdenum are more closely matched than those of silicon and copper. The strain buffers 2, 3 are useful for reducing the rate of wear on the surfaces of the chips 20. The first and second electrodes of the chips 20 may be silver sintered (or otherwise bonded) to the strain buffers 2, 3 to further reduce the risks of fretting and reduce the thermal resistance of the chips 20.

The device 1 further includes a lid flange 6, a housing upper flange 7, a tubular housing element 8, and a housing lower flange 9. These components form a gas-tight (or hermetic) connection between the first conductor 4 and the second conductor 5. The lid flange 6 and the housing upper flange 7 connect the first conductor 4 with the tubular housing element 8. The housing lower flange 9 connects the second conductor 5 with the tubular housing element 8. The conductors 4, 5, the flanges 6, 7, 9 as well as the tubular housing element 8 together form a hermetic housing of the device 1. The semiconductor units 30 are located within the housing between the conductors 4, 5. The housing encloses an internal space 11 which is typically filled with an inert gas (e.g., nitrogen) at a suitable pressure (e.g., approximately one standard atmospheric pressure) to ensure reliable operation of the chips 20. While FIG. 4 shows that the internal space 11 includes separate sections located at opposite sides of each semiconductor unit 30, it would be understood that the separate sections are in fact interconnected in the third dimension relative to the cross-sectional plane of FIG. 4.

The tubular housing element 8 electrically isolates the first conductor 4 from the second conductor 5. The tubular housing element 8 may have a tubular shape (e.g., cylindrical) and primarily comprises an electrically insulating material (e.g., ceramic). It would be appreciated that the tubular housing element 8 may comprise electrically conductive material(s) as far as the electrically conductive material(s) do not form a conducting path between the conductors 4, 5. The tubular housing element 8 typically surrounds the semiconductor units 30. The flanges 6, 7, and 9 may be made of copper or nickel-iron.

In the device 1, the first and second conductors 4, 5 are part of the housing, and thus may also be referred to as housing electrodes. However, it would be appreciated that, in an alternative arrangement, one or more of the conductors 4, 5 may be an intermediate component electrically connected between the semiconductor units 30 and a housing electrode of the device 1. In this way, the housing electrode is joined with one of the flanges 6, 9, and the conductor(s) 4, 5 becomes an internal component that is completely enclosed by the housing of the device 1. Housing electrodes of the device 1 may be considered as power terminals of the device 1, because power current flows from one housing electrode to the other through the device 1 during an on-state of the device 1.

As shown in FIG. 4, the pillars 10 are laterally spaced and parallel to one another. Each pillar 10 extends along a Y axis from an inner surface 17 of the conductive plate 19 into the internal space 11. The conductive plate 19 extends along a plane which is generally perpendicular to the Y axis. While FIG. 4, being a sectional view, shows that the pillars 10 form a one-dimensional array, it would be understood that the pillars 10 may form a one-dimensional or a two dimensional array when viewed along the Y axis.

At least one of the first and second conductors 4, 5 forms a pressure contact with the semiconductor units 30. The remaining one (if any) of the conductors 4, 5 may be fixedly bonded to the semiconductor units 30, by for example using a bonding material. "Pressure contact" means that at least one of the first and second conductors 4, 5 is coupled to the semiconductor units 30 by pressure, and there is a dry interface between the semiconductor units 30 and at least one of the conductors 4, 5. A dry interface means that elements at opposite sides of the interface are coupled solely by pressure, and there is no bonding material between the elements. By clamping the semiconductor units 30 between the conductors 4, 5, the first electrodes of the chips 20 are electrically and thermally coupled to the first conductor 4, and the second electrodes of the chips 20 are electrically and thermally coupled to the second conductor 5.

The hermetic housing of the device 1 further houses a circuit board 15 and electrical connectors 16. In an example, the circuit board 15 may take the form of a printed circuit board (PCB). The circuit board 15 comprises holes 32 (FIG. 10) with sizes equal to or slightly greater than the cross-sectional dimensions of the pillars 10. Therefore, the circuit board 15 is mounted onto the second conductor 5 by passing the pillars 10 through the holes 32. As shown in the inset of FIG. 4, the circuit board 15 comprises an electrically insulating layer 12, a first conductive film and a second conductive film provided on opposite surfaces of the electrically insulating layer 12. The first conductive film forms a first wiring pattern (not shown) comprising first contact pads 13 (or "gate pads" 13). The second conductive film forms a second wiring pattern (not shown) comprising second contact pads 14 (or "auxiliary emitter pads" 14). Each semiconductor chip 20 corresponds to a pair of first and second contact pads 13, 14, which as described below are electrically connected to the gate electrode and the emitter electrode of the respective chip 20. With further reference to the inset of FIG. 4, the pair of first and second contact pads 13, 14 are arranged at the same positions to sandwich the electrically insulating layer 12. All of the first contact pads 13 are interconnected by a branched balanced impedance network (formed by the first wiring pattern) to a gate terminal 22 that penetrates the side wall of the tubular housing element 8. All of the second contact pads 14 are interconnected by a further branched balanced impedance network (formed by the second wiring pattern) to an auxiliary emitter terminal 24 that also penetrates the side wall of the tubular housing element 8. The first wiring pattern may be primarily formed on the upper surface of the electrically insulating layer 12, while the second wiring pattern may be primarily formed on the lower surface of the electrically insulating layer 12. The gate terminal 22 and the auxiliary emitter terminal 24 may also be referred to as a "first control terminal" and a "second control terminal" of the device 1. The circuit board 15 may also be referred to as a driver signal distribution board.

With reference to the inset of FIG. 4, conductive spacers 25 are provided to facilitate the connection between the auxiliary emitter pads 14 and the second conductor 5. The second conductor 5 comprises a recess 21 between the pillars 10. The recess 21 is defined by the inner surface 17 of the conductive plate 19 which is substantially planar, and side surfaces 18 of the pillars 10 which are perpendicular to the inner surface 17. In general, the conductive spacers 25 are formed within the recess 21. In the example of FIG. 4, each conductive spacer 25 is formed at the joint between a respective pillar 10 and the conductive plate 19, and resembles a step at the base of the pillar 10. More specifically, the conductive spacer 25 extends from the surface 17 into the recess 21 along the Y axis, and extends from the side surface 18 of the respective pillar 10 into the recess 21 along a direction parallel to the surface 17. In the example of FIG. 4, the conductive spacers 25 are integrally formed with the pillar 10 and the conductive plate 19. However, it would be appreciated that the conductive spacers 25 may be securedly bonded to the second conductor 5 by, e.g., a soldering, sintering or brazing process, or by using a conductive adhesive. Generally, the conductive spacers 25 are arranged between the auxiliary emitter pads 14 and the conductive plate 19. In the example of FIG. 4, each conductive spacer 25 has an area equal to that of the corresponding auxiliary emitter pad 14, along a plane parallel to the surface 17. The upper surfaces of the conductive spacers 25, which face the circuit board 15, are planar surfaces. On the other hand, the auxiliary emitter pads 14 also have lower, planar, surfaces facing the conductive spacers 25. In this way, a good-quality pressure contact may be formed between the auxiliary emitter pads 14 and the conductive spacers 25 (as described below).

The electrical connectors 16 are compressible connectors, and may take the form of spring loaded pins (e.g., pogo pins). A typical spring-loaded pin may comprise three main parts—a plunger, barrel, and spring. When force is applied to the pin, the spring is compressed and the plunger moves inside the barrel. The compressed spring in the pin in turn applies a force against the plunger, counteracting any unwanted movement which might otherwise cause an intermittent connection. The shape of the barrel retains the plunger, stopping the spring from pushing it out when the pin is not locked in place. Spring loaded pins typically have improved durability over other electrical contacts, and the electrical connections created by spring loaded pins generally show great resilience to mechanical shock and vibration.

The electrical connectors 16 are given a dual purpose. Firstly, they make an electrical connection between the gate electrodes of the chips 20 and the corresponding gate pads 13 of the circuit board 15. Secondly, they apply a mechanical force to the circuit board 15 in order to force a pressure contact between the auxiliary emitter pads 14 on the underside of the circuit board 15 and the conductive spacers 25, thereby electrically connecting the auxiliary emitter pads 14 to the second conductor 5.

The purpose of the conductive spacers 25 is also twofold. Firstly, an ideal pressure contact requires that the two surfaces across the dry interface have matching shapes (or, in this example, each surface being as flat as possible). The conductive plate 19 has a relatively large surface area. It can be difficult during the manufacturing process to ensure the strict flatness of the surface 17 of the conductive plate 19. This is because the surface 17 is typically formed by a material removal process (e.g., milling or etching), and greater error margin can be expected when the material removal process is used on a greater scale. Therefore, without the conductive spacers 25, it could be challenging to ensure that a good pressure contact is formed between each auxiliary emitter pad 14 and the surface 17 of the conductive plate 19, thereby causing some of the chips 20 to be disconnected from the driver circuit. Disconnecting some of the chips 20 from the driver circuit would stress the remaining connected chips 20, thereby jeopardizing the overall performance and the life span of the device 1. By having the conductive spacers 25, the upper surfaces of the conductive spacers 25 can be individually refined or polished so as to ensure that the surfaces of all of the conductive spacers 25 are on the same level. Therefore, the conductive spacers 25 are useful for improving the quality of pressure contact between the auxiliary emitter pads 14 and the second conductor 5.

Secondly, the conductive spacers 25 push up the height of the second wiring pattern formed on the underside of the circuit board 15. Most of the second wiring pattern (apart from the auxiliary emitter pads 14) is spaced apart from the surface 17 of the conductive plate 19, and thus would not be electrically shorted together. This arrangement allows the second wiring pattern to be designed with greater freedom, without having to be provided on the upper side of the circuit board 15 together with the first wiring pattern. Accordingly, the conductive spacers 25 allow a branched balanced impedance network to be easily created between the auxiliary emitter terminal 24 and the auxiliary emitter pads 14.

The inset of FIG. 4 shows that the electrical connector 16 has a central axis C which is parallel to the Y axis. Preferably, the central axis C also passes through (i.e., align with) a centre of the gate electrode of the respective chip 20, a centre of the gate pad 13 on the circuit board 15, and a centre of the auxiliary emitter pad 14 on the underside of the circuit board. The alignment allows the pressure generated by the electrical connector 16 to be efficiently transferred downwards to the interface between the auxiliary emitter pad 14 and the conductive spacer 25.

Figure 5:
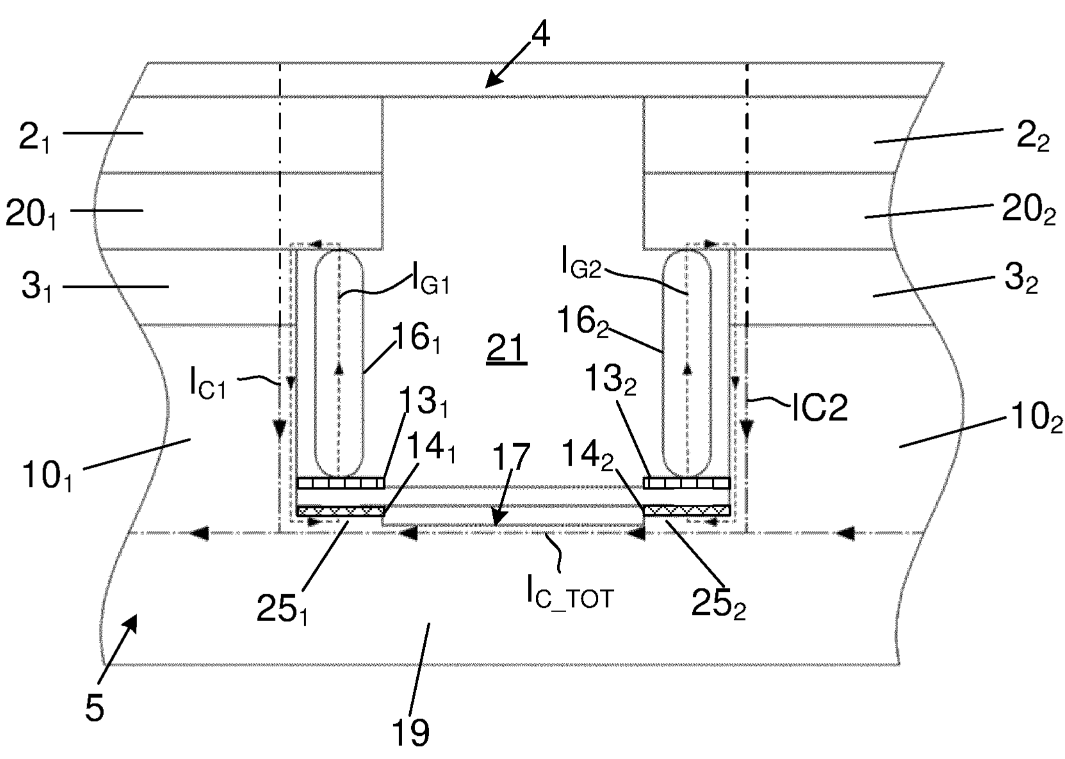
FIG. 5 schematically illustrates current flows in the driver circuit and in the power circuit within the semiconductor device of FIG. 4.

In operation of the device 100, the gate terminal 22 and the auxiliary emitter terminal 24 are connected to a gate node and an emitter node of an external gate drive circuit, respectively. The external gate drive circuit generates a gate current $I_G$ which flows into the gate terminal 22 and out of the auxiliary emitter terminal 24. FIG. 5 illustrates the flow path of the gate current through two chips 201, 202. In FIG. 5, subscripts '1' and '2' are used to identify components that associated with the two chips.

The branched balanced impedance network formed by the first wiring pattern on the upper surface of the circuit board 15 divides the input gate current $I_G$ into $I_{G1}$, $I_{G2}$ . . . . $I_{GN}$ (N being the number of chips 20 within the device 1), each for driving an individual chip. If the first wiring pattern is designed properly, $I_{G1}$, $I_{G2}$ . . . . $I_{GN}$ should be identical to each other. $I_{G1}$ emerges from the gate pad 131, and sequentially flows through the electrical connector 161, the gate electrode of the chip 201, the chip 201, the emitter electrode of the chip 201, the lower strain buffer 31, the pillar 101, the conductive spacer 251, and the auxiliary emitter pad 141. $I_{G2}$ follows a similar path through the chip 202. From the auxiliary emitter pads, $I_{G1}$ and $I_{G2}$ flow through the second wiring pattern on the lower surface of the circuit board 15 and converge on the auxiliary emitter terminal 24 (not shown in FIG. 5).

The gate currents $I_{G1}$, $I_{G2}$ raise the potentials of the gate pads of the IGBT chips 201, 202 with respect to the respective emitter pads of the same chips. A power current $I_{C1}$ sequentially flows through the first conductor 4, the upper strain buffers 21, the collector electrode of the chip 201, the chip 201, the emitter electrode of the chip 201, the lower strain buffer 31, the pillar 101, and the electrode plate 19. $I_{C2}$ follows a similar path through the chip 202. Within the electrode plate 19, the power currents of all of the chips 20 (including $I_{C1}$ and $I_{C2}$) converge, creating a combined power current $I_{C\_TOT}$. The flowing direction of $I_{C\_TOT}$ shown in FIG. 5 is purely exemplary, as the flowing direction depends upon how the connection is made between an external power circuit and the electrode plate 19.

Figure 1:
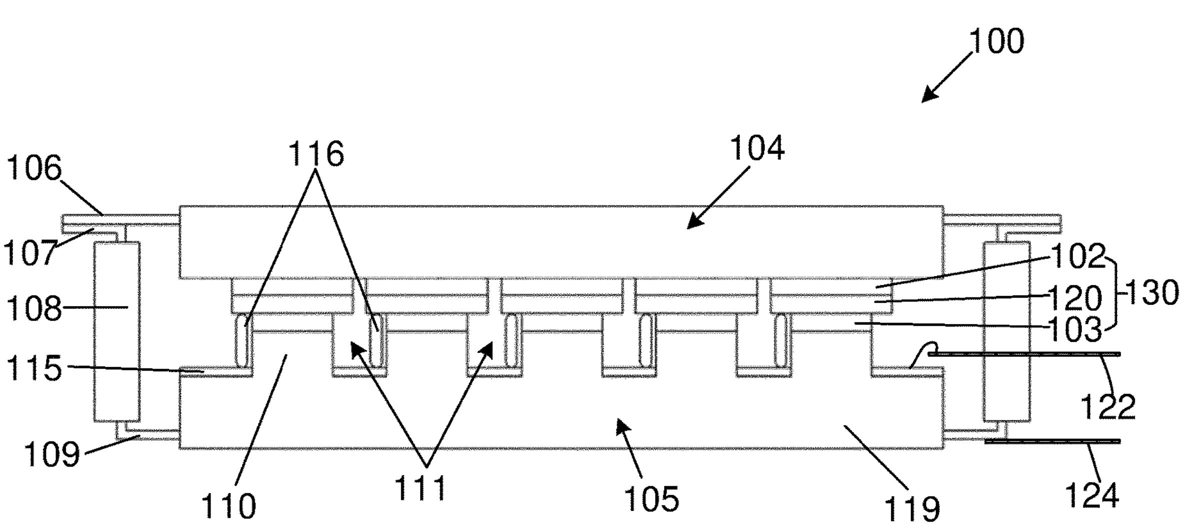
FIG. 1 schematically illustrates a sectional view of a prior semiconductor device.
Figure 2:
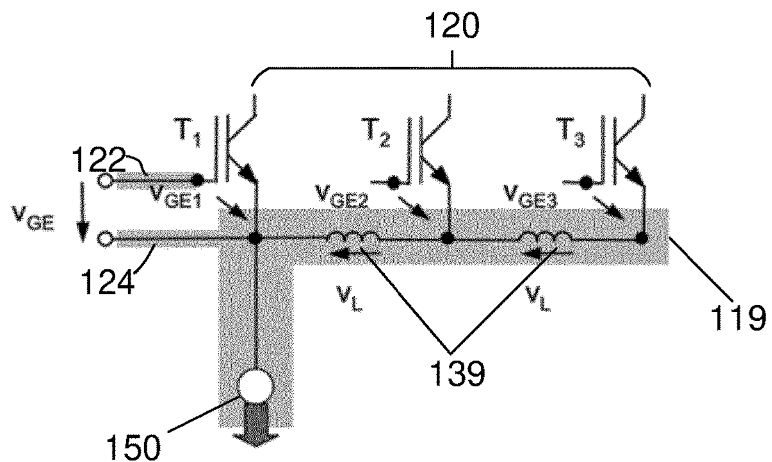
FIG. 2 schematically illustrates a circuit diagram showing a negative-feedback effect caused by a power circuit on the performance of a driver circuit in the semiconductor device of FIG. 1.
Figure 3:
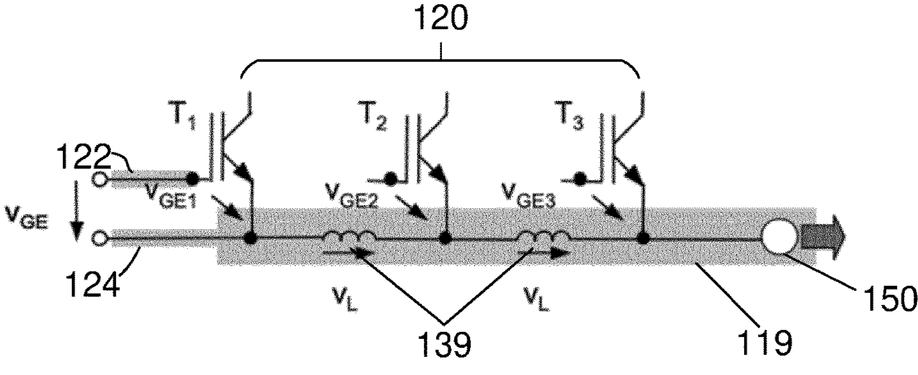
FIG. 3 schematically illustrates a circuit diagram showing a positive-feedback effect caused by the power circuit on the performance of the driver circuit in the semiconductor device of FIG. 1.

With reference to FIG. 5, it can be seen that the driver circuit (along which the gate currents $I_{G1}$, $I_{G2}$ flow) and the power circuit (along which the power currents $I_{C1}$, $I_{C2}$, $I_{C\_TOT}$ flow) share a very short common path in the horizontal direction, and that the length of the common path is a fraction of the length of the conductive spacer 251 or 252. This is in contrast to FIG. 1 where the length of the common path between the driver circuit and the power circuit for an individual chip is the entire or a fraction of the length of the electrode plate 19 (depending upon the location of the particular chip with respect to the emitter control terminal 124).

A very short common path between the driver circuit and the power circuit means that the parasitic inductance of the common path would be very small, and thus the driver circuit is largely decoupled from the power circuit. Regarding the chip 201, the current flow in the driver circuit along the horizontal direction is opposite to the current flow in the power circuit. Regarding the chip 202, the current flow in the driver circuit along the horizontal direction is along the same direction as the current flow in the power circuit. Therefore, theoretically speaking, the induced voltage across the parasitic inductance of the common path would slightly boost (i.e., positive emitter feedback) the gate charge/discharge process in the chip 201, but would be slightly counteractive to (i.e., negative emitter feedback) the gate charge/discharge process in the chip 202. However, considering that the parasitic inductance of the common path is very small and that the induced voltage across the parasitic inductance would be at a negligible level, any current imbalance between the chips 201, 202 would be significantly reduced or almost negligible.

With further reference to FIG. 5, for each of the chips 201, 202, the driver circuit and the power circuit share a substantial length of common path along the vertical direction, and the length of the common path is the height of the pillars 10 along the Y axis. Therefore, the parasitic inductance of the common path along the vertical direction is at a considerable level. However, in the common path, the current flow in the driver circuit is always along the same direction as the current flow in the power circuit. Further, the pillars 10 are typically made with identical dimensions, thus providing identical parasitic inductance. Therefore, the parasitic inductances of the pillars 10 would affect the gate charge/discharge process of the chips in the same way (i.e., symmetrical negative emitter feedback). There would be no current imbalance across the chips 20.

Thus, the device 1 creates connections, which have balanced impedances, between the emitter electrode of each chip and the emitter branch of the driver circuit, without using additional spring loaded pins or reducing the size of the emitter electrode of each chip. The connections are achieved by the creation of auxiliary emitter pads 14 on the underside of the circuit board 15, and the creation of conductive spacers 25 (which resemble steps) each formed at the base of a corresponding pillar 10. The auxiliary emitter pads 14 and the conductive spacers 25 generally align with the gate electrodes of the chips 20. Therefore, the existing electrical connectors 16 not only make electrical connections between the gate electrodes of the chips and the gate pads 13 on the circuit board 15, but also apply a mechanical force to the circuit board 15 in order to force a pressure contact between the auxiliary emitter pads 14 and the conductive spacers 25. The connections are largely decoupled from the power circuit along the length of the conductive plate 19. Thus, during switching, the effect of the power circuit current would not cause noticeable asymmetric variations in gate-emitter voltages across the individual chips 20, and thus the chips 20 tend to turn on and off simultaneously, without noticeable imbalance in the current carried by the individual chips 20. Because no additional spring loaded pins are used, the device 1 can be manufactured in a reliable and cost effective manner. Further because the size of the emitter electrode of each chip is not reduced, the device 1 has maintained its thermal performance.

The conductive spacers 25 are made of an electrically conductive material, e.g., metal. For example, the conductive spacers 25 may be made of copper or nickel-iron. The conductive spacers 25 are rigid, meaning that they would not substantially deform under the pressure exerted by the electrical connectors 16. In contrast, the electrical connectors 16 are compressible, hence deformable and not rigid.

FIG. 4 shows that the device 1 comprises four semiconductor units 30. It would be appreciated that this is purely for conceptual clarity, and that the device 1 may comprise any suitable number (e.g., at least two) of semiconductor units 30. For example, the number of semiconductor units 30 may be chosen based upon the desired overall current rating of the device 1.

While the above description assumes that all of the chips 20 contained within the device 1 are of the same type (e.g., IGBTs), it would be appreciated that the device 1 may house more than one type of semiconductor chips (e.g., IGBTs and diodes), and the driver circuit described above may be applied to a subset of the chips contained within the device 1.

FIGS. 6-9 illustrate partial sectional views of semiconductor devices 1A, 1B, 1C and 1D according to the second to the fifth embodiments of the present disclosure. The view of each figure corresponds to the inset of FIG. 5. Elements of the device 1A/B/C/D that are identical to those of the device 1 are identified using the same labels. Elements of the device 1A/B/C/D that correspond to, but are different from those of the device 1 are labelled using the same numerals but with a letter 'A', 'B', 'C', 'D' for differentiation. The features and advantages described above with reference to the first embodiment are generally applicable to the third, fourth and fifth embodiments.

Figure 6:
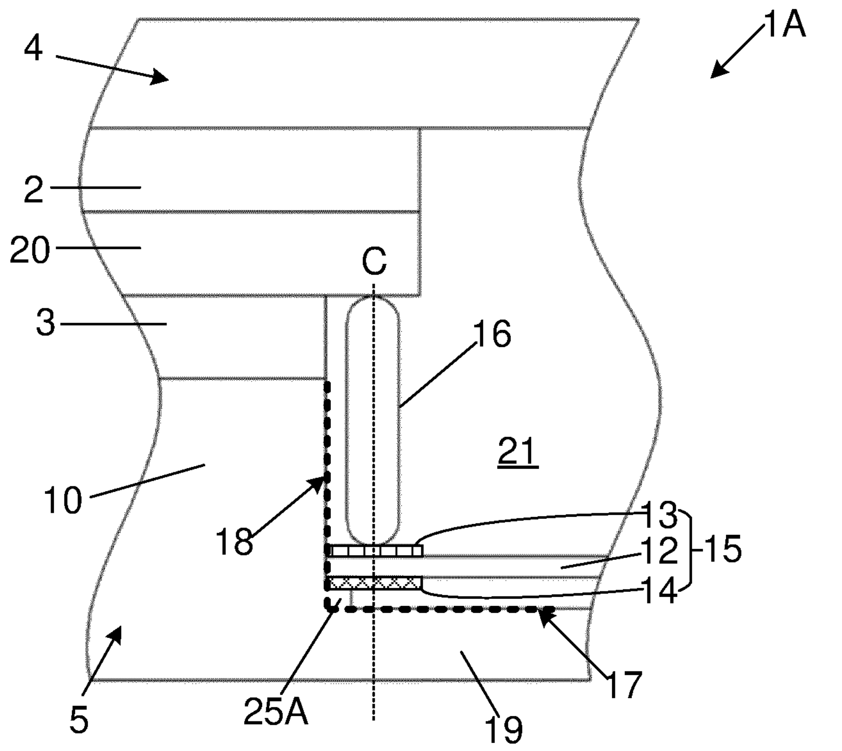
FIG. 6 schematically illustrates a, partial, sectional view of a semiconductor device according to a second embodiment of the present disclosure.

In the device 1A illustrated by FIG. 6, the conductive spacer 25A has a reduced area that is less than the area of the corresponding auxiliary emitter pad 14. More specifically, the conductive spacer 25A extends from the side surface 18 of the pillar 10 into the recess 21 along a direction parallel to the surface 17 of the conductive plate 19, but does not extend beyond the point of contact of the electrical connector 16 on the upper surface of the circuit board 15. The purpose is to cause flexure of the circuit board 15 and to force a higher contact pressure between the edge of the conductive spacer 25A and the auxiliary emitter pad 14 on the circuit board 15.

In the device 1 or 1A, the conductive spacer 25 or 25A joins with the surface 17 of the conductive plate 19. However, in the device 1B illustrated by FIG. 7, the conductive spacer 25B is integrally formed (or securely bonded) with the pillar 10, but is spaced apart from the surface 17 of the conductive plate 19 by a gap 28. The gap 28 is in fluid communication with the internal space 11 (not shown in FIG. 7) of the device 1B and is typically filled with an inert gas (e.g., nitrogen) at a suitable pressure. In other words, the conductive spacer 25B resembles an undercut step. Providing a gap 28 between the conductive spacer 25B and the conductive plate 19 improves mechanical compliance and further decouples the driver circuit from the power circuit. It would be understood that by having the gap 28, there is no common path between the driver circuit and the power circuit along the conductive plate 19. Therefore, during switching, the power circuit current would not cause any imbalance in the currents carried by the individual chips 20 of the device 1B.

Figures 7, 8:
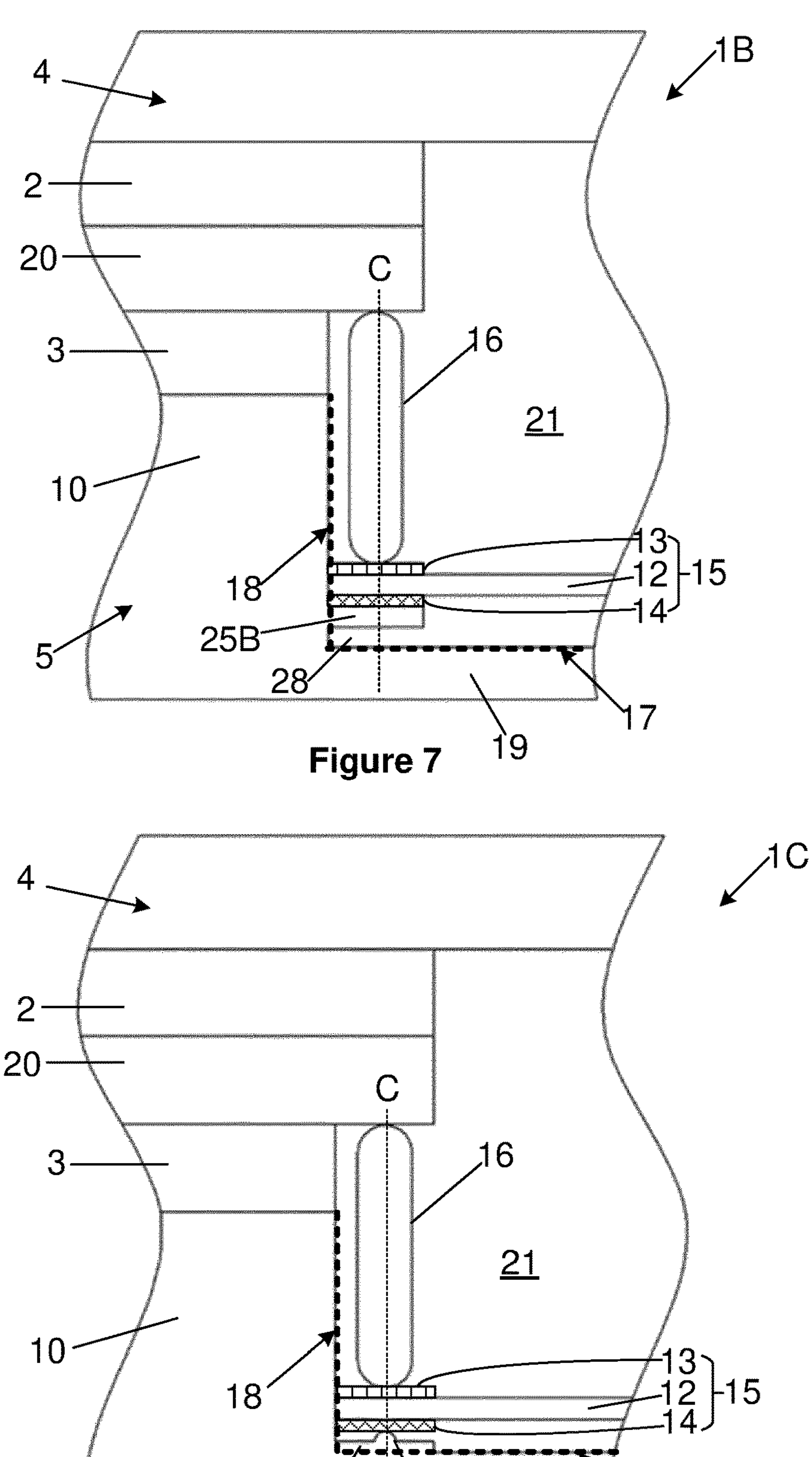
FIG. 7 schematically illustrates a, partial, sectional view of a semiconductor device according to a third embodiment of the present disclosure.
FIG. 8 schematically illustrates a, partial, sectional view of a semiconductor device according to a fourth embodiment of the present disclosure.
Figure 9:
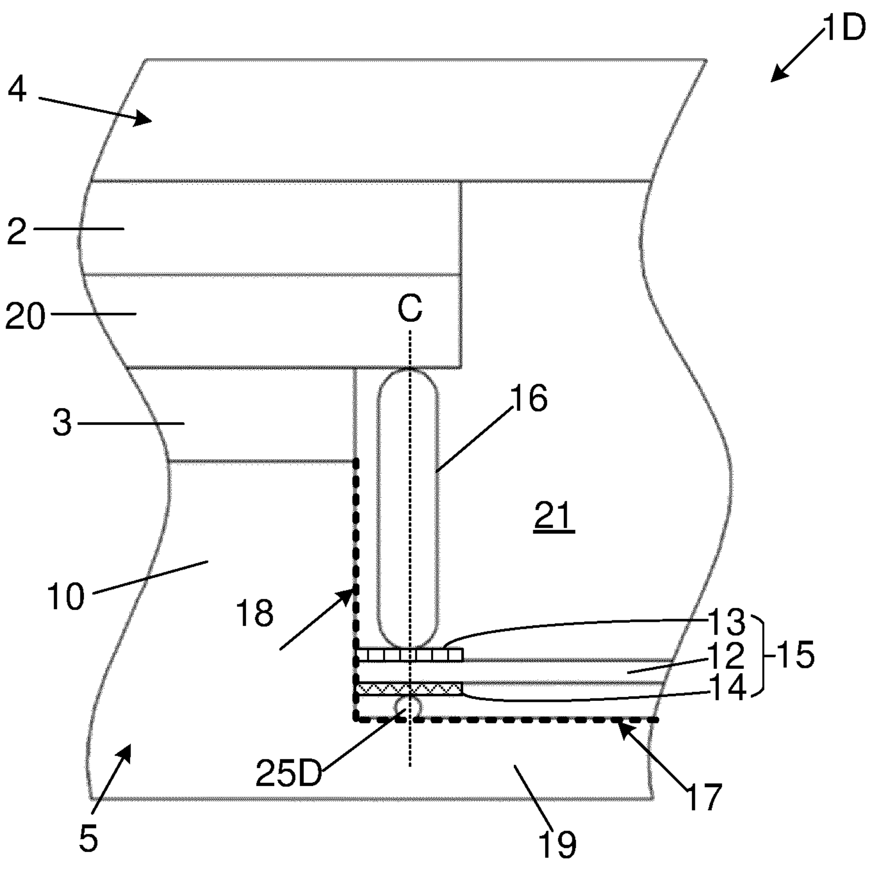
FIG. 9 schematically illustrates a, partial, sectional view of a semiconductor device according to a fifth embodiment of the present disclosure.

In the device 1C illustrated by FIG. 8, the conductive spacers 25C has a planar surface facing the circuit board 15, and a contact region 29 which protrudes over the planar surface. The contact region 29 is in the form of a bump or a point, and has a smaller area than the planar surface. The contact region 29 is useful for increasing the contact pressure between the auxiliary emitter pad 14 and the conductive spacer 25, considering that the contact area is reduced for the same force exerted by the electrical connector 16. An increased contact pressure lowers the electrical contact resistance between the auxiliary emitter pad 14 and the conductive spacer 25.

In the embodiments described above, the conductive spacers 25, 25A-C are formed integrally with the second conductor 5 and are made of the same material as the second conductor 5. In the device 1D illustrated by FIG. 9, the conductive spacer 25D is formed from a separate material, either on the surface of the auxiliary emitter pad 14 or on the surface of the conductive plate 19 of the second conductor 5. The material of the conductive spacer 25D is an electrically conductive material. The conductive spacer 25D may be fixedly attached to the lower surface of the auxiliary emitter pad 14 or the surface 17 of the conductive plate 19 by a suitable process, such as wire bonding, soldering, sintering or use of a conductive adhesive.

Figure 10:
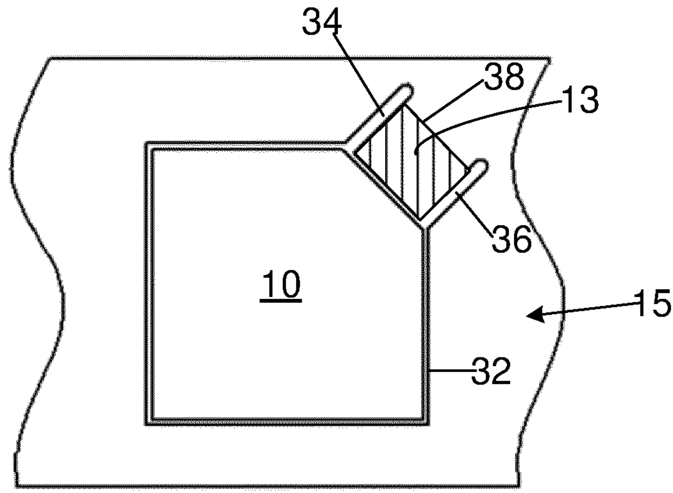
FIG. 10 schematically illustrates a, partial, top view of a circuit board for use in the semiconductor devices of the present disclosure.

As described above, the circuit board 15 comprises holes 32 penetrated by the pillars 10. The circuit board 15 may further be weakened around the gate pads 13 (and/or the auxiliary emitter pads 14) by the cutting of slots 34, 36, as shown in FIG. 10. FIG. 10 shows a, partial, top view of the circuit board 15. The hole 32 is of the shape of a pentagon. One side of the hole 32 is aligned with an edge of a gate pad 13. The slots 34, 36 extend through the entire thickness of the circuit board 15, and are arranged at opposite sides of the gate pad 13. As such, the gate pad 13 has three sides which are detached from the circuit board 13, and a fourth side 38 which is connected to the circuit board 13. The slots 34, 36 are useful for improving mechanical compliance of the circuit board 15 and maximising the transfer of pressure to the interface between the auxiliary emitter pad 14 and the conductive spacers. It would be understood that the circuit board 15 as shown in FIG. 10 may be applied to each of the devices 1, 1A to 1D.

While FIGS. 4 to 9 relate to multi-chip press-pack power semiconductor devices, it would be appreciated that the circuit board 15, the electrical connectors 16 and the conductive spacers 25, 25A to 25D may be applied to any suitable semiconductor device.

FIG. 11 schematically illustrates processing steps of a method for manufacturing a semiconductor device (e.g., any one of the devices 1, 1A to 1D).

At step S1, a plurality of semiconductor chips (e.g., the semiconductor chips 20) are provided.

At step S2, a first conductor (e.g., the first conductor 4) and a second conductor (e.g., the second conductor 5) are arranged at opposite sides of the semiconductor chips. The second conductor comprises a plurality of pillars (e.g., the pillars 10). Each of the semiconductor chips comprises: a first surface facing the first conductor; a first electrode arranged on the first surface and electrically coupled to the first conductor; a second surface opposite to the first surface; a second electrode arranged on the second surface and electrically coupled to a respective one of the pillars, and a control electrode arranged on the second surface and configured to switch a current flowing between the first electrode and the second electrode.

At step S3, the plurality of pillars are passed through openings (e.g., the opening 32) of a circuit board (e.g., the circuit board 15). The circuit board further comprises an electrically insulating layer (e.g., the layer 12), a first conductive film and a second conductive film provided on opposite surfaces of the electrically insulating layer. The first conductive film is configured to form a first wiring pattern comprising first contact pads (e.g., the gate pads 13), and the second conductive film is configured to form a second wiring pattern comprising second contact pads (e.g., the auxiliary emitter pads 14).

At step S4, a plurality of electrical connectors (e.g., the electrical connectors 16) are used to electrically connect the control electrodes of the semiconductor chips and respective ones of the first contact pads, and to apply a pressure against the circuit board.

At step S5, a plurality of conductive spacers (e.g., the conductive spacers 25, 25A to 25D) which are fixedly connected to either the second conductor or respective ones of the second contact pads are provided. The second contact pads are electrically coupled, via the conductive spacers, to the second conductor by the pressure.

It would be appreciated that the steps may be performed in a temporal order that is different from the order of description. For example, step S2 may comprise two sub-steps, which arrange the first conductor and the second conductor, respectively, and steps S1, S3 to S5 may be performed between the two sub-steps.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The skilled person will understand that in the preceding description and appended claims, positional terms such as 'upper', 'lower', 'top', 'bottom', 'lateral', 'horizontal', 'vertical' etc. are made with reference to conceptual illustrations of a semiconductor device, such as those showing standard layout plan views and those shown in the appended drawings. These terms are used for ease of reference but are not intended to be of limiting nature. These terms are therefore to be understood as referring to a semiconductor device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A semiconductor device, comprising:

a plurality of semiconductor chips;

a first conductor and a second conductor arranged at opposite sides of the semiconductor chips, wherein the second conductor comprises a plurality of pillars, and wherein each of the semiconductor chips comprises: a first surface facing the first conductor; a first electrode arranged on the first surface and electrically coupled to the first conductor; a second surface opposite to the first surface; a second electrode arranged on the second surface and electrically coupled to a respective one of the pillars, and a control electrode arranged on the second surface and configured to switch a current flowing between the first electrode and the second electrode;

a circuit board comprising openings penetrated by the plurality of pillars, wherein the circuit board further comprises an electrically insulating layer, a first conductive film and a second conductive film provided on opposite surfaces of the electrically insulating layer, and wherein the first conductive film is configured to form a first wiring pattern comprising first contact pads, and the second conductive film is configured to form a second wiring pattern comprising second contact pads;

a plurality of electrical connectors which electrically connect the control electrodes of the semiconductor chips and respective ones of the first contact pads and are configured to apply a pressure against the circuit board; and a plurality of conductive spacers which are fixedly connected to either the second conductor or respective ones of the second contact pads, and wherein the second contact pads are electrically coupled, via the conductive spacers, to the second conductor solely by the pressure.

2. A semiconductor device according to claim 1, wherein a centre of at least one of the first contact pads is aligned with a centre of at least one of the second contact pads.

3. A semiconductor device according to claim 1, wherein a centre of at least one of the first contact pads is aligned with a centre of at least one of the control electrodes of the semiconductor chips.

4. A semiconductor device according to claim 1, wherein the electrical connectors are compressible connectors and/or spring loaded connectors.

5. A semiconductor device according to claim 1, wherein the conductive spacers are rigid.

6. A semiconductor device according to claim 1, further comprising:

a first control terminal electrically connected to the first wiring pattern;

a second control terminal electrically connected to the second wiring pattern;

a first power terminal formed by or electrically connected to the first conductor; and a second power terminal formed by or electrically connected to the second conductor; and wherein the first and second control terminals are for controlling a current flowing between the first power terminal and the second power terminal.

7. A semiconductor device according to claim 1, wherein the second conductor comprises a recess between the plurality of pillars, and the conductive spacers are arranged within the recess, and at least one of the conductive spacers extends from a respective one of the pillars into the recess.

8. A semiconductor device according to claim 6, wherein the at least one of the conductive spacers does not extend beyond a point of contact between a respective electrical connector and a respective first contact pad.

9. A semiconductor device according to claim 1, wherein the second conductor comprises a conductive plate extending between at least some of the pillars, and the conductive plate comprises a planar surface facing the semiconductor chips.

10. A semiconductor device, comprising:

a plurality of semiconductor chips;

a first conductor and a second conductor arranged at opposite sides of the semiconductor chips, wherein the second conductor comprises a plurality of pillars, and wherein each of the semiconductor chips comprises: a first surface facing the first conductor; a first electrode arranged on the first surface and electrically coupled to the first conductor; a second surface opposite to the first surface; a second electrode arranged on the second surface and electrically coupled to a respective one of the pillars, and a control electrode arranged on the second surface and configured to switch a current flowing between the first electrode and the second electrode;

a circuit board comprising openings penetrated by the plurality of pillars, wherein the circuit board further comprises an electrically insulating layer, a first conductive film and a second conductive film provided on opposite surfaces of the electrically insulating layer, and wherein the first conductive film is configured to form a first wiring pattern comprising first contact pads, and the second conductive film is configured to form a second wiring pattern comprising second contact pads;

a plurality of electrical connectors which electrically connect the control electrodes of the semiconductor chips and respective ones of the first contact pads and are configured to apply a pressure against the circuit board; and a plurality of conductive spacers which are fixedly connected to either the second conductor or respective ones of the second contact pads, and wherein the second contact pads are electrically coupled, via the conductive spacers, to the second conductor by the pressure, wherein the second conductor comprises a conductive plate extending between at least some of the pillars, and the conductive plate comprises a planar surface facing the semiconductor chips, and wherein at least one of the conductive spacers has a surface which faces the conductive plate and is spaced apart from the planar surface of the conductive plate.

11. A semiconductor device according to claim 9, wherein the second wiring pattern is separated from the planar surface of the conductive plate by the conductive spacers.

12. A semiconductor device according to claim 9, wherein at least one of the conductive spacers is fixedly connected to a respective one of the pillars and the conductive plate.

13. A semiconductor device according to claim 1, wherein at least one of the conductive spacers comprises a planar surface, which faces the semiconductor chips and is configured to form a pressure contact with a respective one of the second contact pads.

14. A semiconductor device according to claim 13, wherein the planar surface of the at least one of the conductive spacers has an area which is less than or equal to an area of the respective one of the second contact pads.

15. A semiconductor device according to claim 1, wherein at least one of the conductive spacers comprises a planar surface facing the semiconductor chips, and a contact region which protrudes over the planar surface, and wherein the contact region has a smaller area than the planar surface and is configured to form a pressure contact with a respective one of the second contact pads.

16. A semiconductor device according to claim 1, wherein the circuit board comprises a slot which extends through the electrically insulating layer and partially surrounds at least one of the first contact pads and/or at least one of the second contact pads.

17. A semiconductor device according to claim 1, wherein the conductive spacers are made of a material different from a material of the second conductor and/or a material of the second contact pads and/or wherein the semiconductor chips are electrically coupled to the first conductor and/or the second conductor by pressure.

18. A semiconductor device according to claim 1, wherein at least one of the semiconductor chips is an insulated gate bipolar transistor.

19. A semiconductor device according to claim 1, further comprising a first strain buffer electrically connected between the first electrode and the first conductor, and a second strain buffer electrically connected between the second electrode and the respective one of the pillars.

20. A method of manufacturing a semiconductor device, comprising:

providing a plurality of semiconductor chips;

arranging a first conductor and a second conductor at opposite sides of the semiconductor chips, wherein the second conductor comprises a plurality of pillars, and wherein each of the semiconductor chips comprises: a first surface facing the first conductor; a first electrode arranged on the first surface and electrically coupled to the first conductor; a second surface opposite to the first surface; a second electrode arranged on the second surface and electrically coupled to a respective one of the pillars, and a control electrode arranged on the second surface and configured to switch a current flowing between the first electrode and the second electrode;

passing the plurality of pillars through openings of a circuit board, wherein the circuit board further comprises an electrically insulating layer, a first conductive film and a second conductive film provided on opposite surfaces of the electrically insulating layer, and wherein the first conductive film is configured to form a first wiring pattern comprising first contact pads, and the second conductive film is configured to form a second wiring pattern comprising second contact pads;

using a plurality of electrical connectors to electrically connect the control electrodes of the semiconductor chips and respective ones of the first contact pads, and to apply a pressure against the circuit board; and providing a plurality of conductive spacers which are fixedly connected to either the second conductor or respective ones of the second contact pads, wherein the second contact pads are electrically coupled, via the conductive spacers, to the second conductor solely by the pressure.

* * * * *